US009383860B2

(12) United States Patent
Aaltonen et al.

(10) Patent No.: US 9,383,860 B2
(45) Date of Patent: Jul. 5, 2016

(54) CAPACITANCE PROCESSING CIRCUIT AND A MEMS DEVICE

(71) Applicant: MURATA MANUFACTURING CO., LTD., Kyoto (JP)

(72) Inventors: Lasse Aaltonen, Espoo (FI); Teemu Salo, Riihimäki (FI); Tero Sillanpää, Espoo (FI)

(73) Assignee: MURATA MANUFACTURING CO., LTD., Nagaokakyo-Shi, Kyoto (JP)

( * ) Notice: Subject to any disclaimer, the term of this patent is extended or adjusted under 35 U.S.C. 154(b) by 0 days.

(21) Appl. No.: 14/546,370

(22) Filed: Nov. 18, 2014

(65) Prior Publication Data

US 2015/0145589 A1    May 28, 2015

(30) Foreign Application Priority Data

Nov. 22, 2013 (FI) ...................................... 20136168

(51) Int. Cl.
*H01L 41/00* (2013.01)
*H03K 17/945* (2006.01)
*G06F 3/041* (2006.01)
(Continued)

(52) U.S. Cl.
CPC .............. *G06F 3/0416* (2013.01); *G06F 3/044* (2013.01); *H03M 1/0619* (2013.01); *H03M 1/0621* (2013.01); *H03K 2217/94073* (2013.01); *H03K 2217/9607* (2013.01); *H03K 2217/96015* (2013.01); *H03M 1/124* (2013.01)

(58) Field of Classification Search
CPC ................... G06F 3/0416; H03K 2217/96015; H03K 2217/9607; H03K 2217/94073

USPC .......................... 327/337, 509, 516, 517, 561
See application file for complete search history.

(56) References Cited

U.S. PATENT DOCUMENTS 5,701,253 A * 12/1997 Mayell ................. G01R 21/133
                                                    324/142
8,338,896 B2 * 12/2012 Kanemoto .......... G01P 15/0802
                                                    257/415
(Continued)

FOREIGN PATENT DOCUMENTS

EP         2 647 593 A2     10/2013
GB         2459864 A        11/2009
WO    WO 2005/041418 A1      5/2005

OTHER PUBLICATIONS

Finnish Search Report dated Sep. 29, 2014 corresponding to Finnish Patent Application No. 20136168.
(Continued)

*Primary Examiner* — Dinh T Le
(74) *Attorney, Agent, or Firm* — Squire Patton Boggs (US) LLP

(57) ABSTRACT

The claims define a processing circuit for processing input signals from a capacitive transducer structure. A current-to-voltage converter receives two input signals from the capacitive transducer structure, and outputs two output signals to gain stage circuits, and to a reference voltage generator. The gain stages generate from the output voltage signals a differential output signal. The reference voltage generates from the output signals a common mode output signal. The processing circuit generates a digital signal that corresponds to a quotient of the differential output signal and the common mode output signal.

17 Claims, 7 Drawing Sheets

(51) Int. Cl.
*H03M 1/06* (2006.01)
*G06F 3/044* (2006.01)
*H03M 1/12* (2006.01)

(56) References Cited

U.S. PATENT DOCUMENTS

| | | | |
|---|---|---|---|
| 8,687,823 B2* | 4/2014 | Loeppert | H03G 1/0088 |
| | | | 381/107 |
| 8,878,570 B2* | 11/2014 | Thomsen | H03K 5/00 |
| | | | 327/108 |
| 2010/0103014 A1 | 4/2010 | Quiquempoix et al. | |

OTHER PUBLICATIONS

M. Saukoski et al., "Readout Electronics with Bandpass Delta-Sigma A/D Converter for a Bulk Micromachined Capacitive Gyroscope," Instrumentation and Measurement Technology Conference, May 17-19, 2005, IMTC, Proceedings of the IEEE vol. 2, pp. 769-774.

M. Saukoski et al., "Fully Integrated Charge Sensitive Amplifier for Readout of Micromechanical Capacitive Sensors," Circuits and Systems, 2005, ISCAS, IEEE International Symposium on, vol. 6, pp. 5377-5380.

International Search Report application No. PCT/IB2014/066189 mailed Mar. 26, 2015.

* cited by examiner

CAPACITANCE PROCESSING CIRCUIT AND A MEMS DEVICE

BACKGROUND

1. Field

The present invention relates to capacitive transducers, especially techniques for processing input signals from a capacitive transducer structure into a digital output signal.

2. Description of the Related Art

Micro-Electro-Mechanical Systems or MEMS can be defined as micro-scale mechanical and electro-mechanical systems where at least some elements have a mechanical functionality. MEMS structures can be applied to quickly and accurately detect very small changes in physical properties.

The vast majority of electronic devices today use the MEMS sensors to detect some specific physical phenomenon. The conditioning and processing of the electrical signal from the sensor is an important stage, since the generated signals can be quite small, and are easily corrupted by ambient interferences. Many MEMS sensors apply capacitive transducers to transform events from the physical domain into electrical signals that are suitable for further processing. In most cases, the output from the capacitive transducers requires amplification and conditioning to provide the best possible signal for analog-to-digital conversion. A combination of conditioning circuitry is often called an analog front end. The analog front end may also include the circuitry for the analog-to-digital conversion.

Capacitive transducers in MEMS sensors often apply differential detection with two capacitors. For differential detection, in response to a detected activity, a first capacitor of a capacitor pair generates a first input signal, and a second capacitor of the capacitor pair generates a second input signal. The first input signal and the second input signal may be detected in parallel and processed in combination for added accuracy.

A conventional measurement principle applied with differential detection has been a self-balancing capacitor bridge where the capacitive transducer consists of a movable plate with a fixed electrode on each side. Together the three electrodes form two capacitors. Deflection of the plate is normalized with respect to the distance between the fixed electronics. The normalization of the self-balancing capacitor bridge provides a linear and stable transfer function, but higher signal-to-noise levels are required for many modern applications.

A number of further methods to improve the signal-to-noise levels in capacitance-to-voltage conversion have been introduced. For example, correlated double sampling and/or chopping techniques have been combined to active or passive common mode charge cancellation. These solutions provide improved signal-to-noise levels, but their output is directly proportional to the differential sensor capacitance. However, in the absence of normalization, the linearity in gap modulated capacitive electrodes in MEMS is reduced. In addition, the circuit tends to be sensitive to possible mismatch between MEMS capacitors in the capacitive transducer and ASIC capacitors in the analog front end circuit.

SUMMARY

The object of the present invention is to provide an analog front end configuration that enables achieving improved signal-to-noise levels without compromising the linearity of the response. The objects of the present invention are achieved with a processing circuit according to the characterizing portions of the independent claims.

The claims define a processing circuit for processing input signals from a capacitive transducer structure. The processing circuit includes a current-to-voltage converter, one or more successive gain stage circuits, a reference voltage generator, and an analog-to-digital converter. The current-to-voltage converter includes circuitry for receiving a first input signal and a second input signal from the capacitive transducer structure, outputting to a first gain stage of the gain stage circuits, and to the reference voltage generator a first voltage signal that corresponds to the first input signal, and a second voltage signal that corresponds to the second input signal. The gain stages include circuitry for generating from the first voltage signal and the second voltage signal a differential output signal. The reference voltage generator includes circuitry for generating from the first voltage signal and the second voltage signal a common mode output signal. The processing circuit includes dividing circuitry for generating a digital signal that corresponds to a quotient of the differential output signal and the common mode output signal.

The claims define also a microelectromechanical device comprising the processing circuit.

The present invention introduces a novel circuit structure that implements a normalized transfer function and thereby a linear and stable response to a quantity measured with a capacitive transducer.

Further advantages of the invention are discussed in more detail with the following embodiments.

BRIEF DESCRIPTION OF THE DRAWINGS

In the following the invention will be described in greater detail, in connection with preferred embodiments, with reference to the attached drawings, in which.

DETAILED DESCRIPTION

Figure 1:
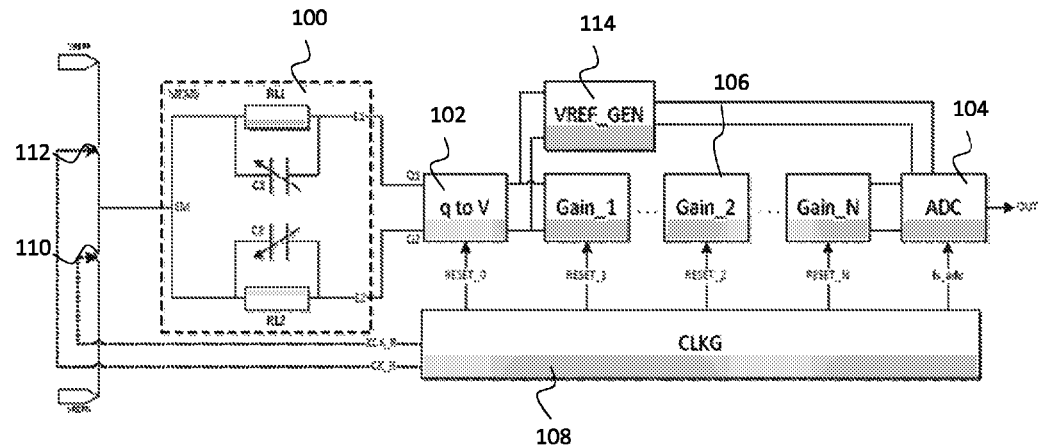
FIG. 1 illustrates elements of an exemplary processing circuit.

The following embodiments are exemplary. Although the specification may refer to "an", "one", or "some" embodiment(s), this does not necessarily mean that each such reference is to the same embodiment(s), or that the feature only applies to a single embodiment. Single features of different embodiments may be combined to provide further embodiments.

In the following, features of the invention will be described with a simple example of a circuit structure with which various embodiments of the invention may be implemented. Only elements relevant for illustrating the embodiments are described in detail. Components and implementations of circuit structures that are generally known to a person skilled in the art may not be specifically described herein.

The invention is applicable to any circuit structure or combination of circuit structures that is capable of processing input signals of a capacitive transducer structure into a digital or analog output signal. A signal may refer herein to any impulse or a fluctuating electric quantity, such as voltage, current, or electric field strength, whose variations represent variation of another quantity. The term transducer refers in general to a device that converts one form of energy to another. Electromechanical transducers are devices that convert mechanical energy to electrical energy, for example mechanical motion into variations of electric current or voltage, and vice versa. The term capacitive transducer is used herein to refer to an entity that includes at least one capacitor with variable capacitance. In an apparatus, the capacitance of the capacitive transducer structure may be configured to change due to a change in the value of a selected input quantity, like motion of the seismic mass.

The capacitive transducer structure may include one or more rotors. The term rotor refers here to a capacitive element that is mechanically connected to a seismic mass suspended to a support structure, and thereby interactively coupled to move along the motion of the seismic mass in space. The capacitive transducer structure may also include one or more stators. The term stator refers here to a capacitive element that is anchored to a support structure. Depending on the configuration, the stators and rotors may be anchored and suspended to a same support structure, or to different support structures. Rotors and stators of the structure are configured to form pairs that are positioned opposite to each other i.e. set over against the other across an intervening space. An electrical energy source may be used to create voltage over a pair of stator and rotor elements, which form a capacitor. When the rotor moves in relation to the stator, a current through the capacitor may be detected and input to a processing circuit.

A capacitive transducer structure may include at least two capacitors that due to the mechanical properties of the structure react to an input quantity in a similar way, but generate output electrical signals with opposite polarity. Such a capacitor pair may be used for differential detection such that in response to a detected activity, a first capacitor of a capacitor pair generates a first input signal, and a second capacitor of the capacitor pair generates a second input signal. The first input signal and the second input signal may then be detected in parallel and processed in combination for added accuracy.

FIG. 1 illustrates elements of an exemplary processing circuit applicable for processing input signals of a capacitive transducer structure into digital form. The capacitive transducer 100 may be a stand-alone device, or it may be a portion of a larger device. Such device may be, for example, a combined sensor element that includes a variety of sensor elements, a wired or mobile computing, gaming or communication device, a measurement device, a rendering device, or a vehicle function control unit, to name a few. FIG. 1 shows a capacitive transducer structure 100 that may, in the above described manner, be arranged to produce a first variable capacitance C1 and a second variable capacitance C2. In FIG. 1, the variable capacitances C1, C2 are illustrated to result from a motion of a common rotor electrode EM in relation to stator electrodes E1 and E2. Imperfections of the capacitors C1, C2 are illustrated with parallel resistances RL1, RL2, respectively. The capacitive transducer structure may generate a first signal Q1, which corresponds to the current through the first variable capacitance C1, and a second signal Q2, which corresponds to the current through the second variable capacitance C2.

The processing circuit may include a current-to-voltage converter 102, an analog-to-digital converter 104, and one or more successive gain stage circuits 106 between the current-to-voltage converter 102 and the analog-to-digital converter 104. The processing circuit may also include a switch configuration that includes a timing control element 108 and a plurality of switches 110, 112. The switched connections within the processing circuit open and close in control of the timing control element 108 such that the later disclosed functions of the elements of the processing circuit are implemented.

The current-to-voltage converter 102 may be directly or indirectly connected to the capacitive transducer structure 100 to receive a first input signal Q1 and a second input signal Q2. It is noted that the expression direct connection indicates here that an output node of one element is directly coupled to an input node of another element. The expression indirect connection correspondingly indicates that the connection path between an output node of one element to an input node of another element may include further intermediate components.

Figure 2:
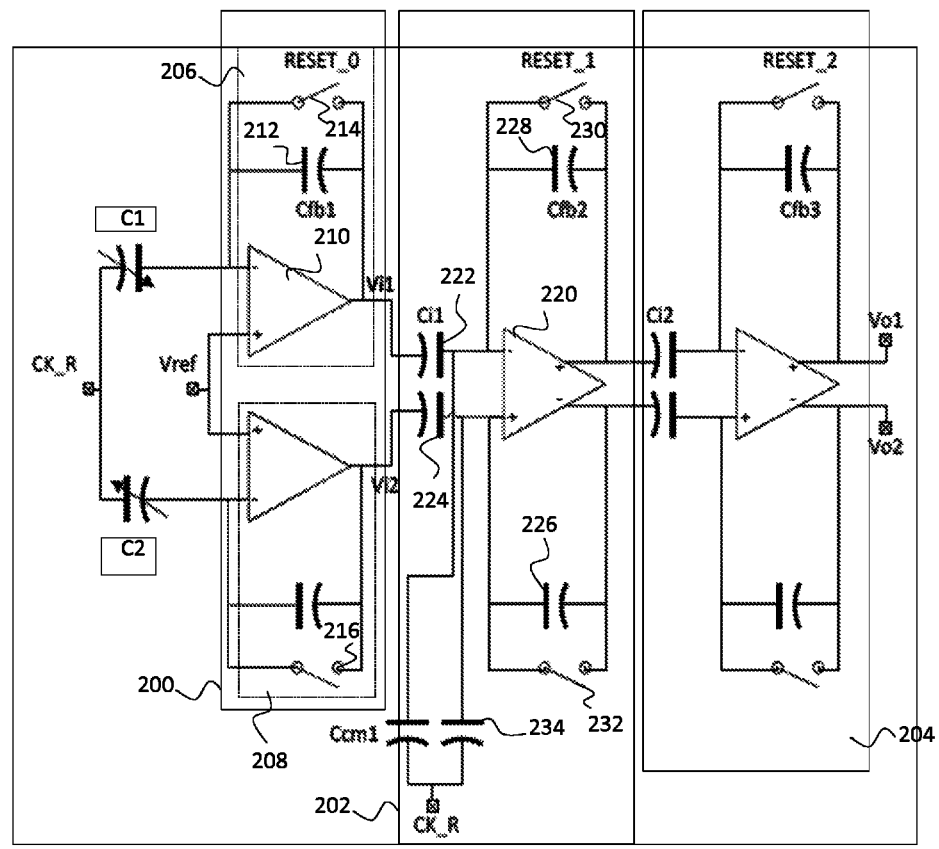
FIG. 2 illustrates a current-to-voltage converter and gain stage circuit structures.

The current-to-voltage converter 102 may include circuitry for generating voltage output signals that may be forwarded to the gain stage circuits 106 for signal amplification. FIG. 2 illustrates in more detail an exemplary implementation of current-to-voltage converter and gain stage circuit structures. Other components or circuit configurations, capable of performing the claimed features may be applied without deviating from the scope of protection. The exemplary configuration includes a current-to-voltage generator 200, and two gain stage circuits 202, 204.

The current-to-voltage generator 200 may include operational amplifier circuits 206, 208 for both of the input signal legs of capacitors C1, C2. As an alternative, a differential amplifier with input common-mode feedback circuit may be applied, to name one. An operational amplifier circuit 206 may include a single-ended operational amplifier 210, a feedback capacitor 212, and a reset switch 214. The first input signal from the first capacitor C1 may be input to the inverting terminal of the operational amplifier of the first circuit 206 and the second input signal from the second capacitor C2 may be input to the inverting terminal of the operational amplifier of the second circuit 208. As shown, switches 214, 216 advantageously reset the operational amplifier circuits 206, 208 synchronously.

A switched-capacitor gain circuit 202 may include a differential output amplifier 220, input capacitors 222, 224 for voltages Vi1, Vi2 from the current-to-voltage converter 200, and integrating feedback capacitors 226, 228. One of the input capacitors 222 may be connected to the inverting input, and the other input capacitor 224 may be connected to the non-inverting input of the differential output amplifier 220. Synchronously timed switches 230, 232 may be used to reset charges stored in the capacitors in a manner that is discussed later on. The first gain circuit may include also common mode capacitors 234, which will also be described in more detail later on.

Returning back to FIG. 1, the gain stage circuits Gain_1, Gain_2, . . . , Gain_N 106 may be connected to amplify the first output signal Vi1 and the second output signal Vi2, and feed the amplified signals to the analog-to-digital converter 104 that represents here any analog signal processing block. The amplified signals from the last gain stage Gain_N may be fed directly to the analog-to-digital converter 104, or the processing circuit may include further processing stages after the amplification, as will be discussed later on. Output voltage from the measurement chain to the analog-to-digital converter 104 is a differential or a single ended output signal proportional to the difference (C1–C2) of the measured capacitances C1 and C2.

As shown in FIG. 1, the processing circuit may also include a reference voltage generator 114 that is configured to generate a common mode output signal that corresponds to a common mode component of Vi1 and Vi2. The common mode output signal may be implemented with a single signal or a combination of two or more signals, as shown in FIG. 1. The common mode component is not related to the measured quantity and in the gain stages of the processing circuit it is effectively cancelled. The processing circuit of FIG. 1, however, includes circuitry with which the common mode of voltages Vi1 and Vi2 may be collected after the current-to-voltage conversion (before the cancellation), and thereafter fed as a reference voltage to the analog-to-digital converter 104. In the exemplary circuit structure of FIG. 1, the reference voltage generator generates a third output signal and a fourth output signal, a difference of which corresponds to the common mode component of the first output signal Vi1 and the second input signal Vi2. The third output signal and the fourth output signal may be fed to the differential analog-to-digital converter 104 and applied therein as reference voltages. The analog-to-digital converter may thus output a digital signal that corresponds to a quotient of the differential output signal and the common mode output signal. The resulting DC transfer function of the processing circuit becomes thereby proportional to the ratio between the difference (C1–C2) and the sum (C1+C2) of the measured capacitances C1 and C2:

$$\text{Out}(C1, C2) = \frac{C1 - C2}{C1 + C2} \cdot Const \quad (1)$$

where Const is a constant value for each specific capacitive transducer and processing circuit configuration. As discussed earlier, this normalized transfer function enables provision of a very linear and stable response to the measured quantity. The claimed configuration provides a very compact structure with which the desired transfer function can be effectively achieved.

In more general, the processing circuit includes dividing circuitry for generating a digital signal that corresponds to a quotient of the differential output signal and the common mode output signal. It is noted that for a person skilled in the art it is clear that circuit variations applying this principle may be created. For example, the exemplary processing circuit of FIG. 1 uses a single analog-to-digital converter 104 block to generate the quotient of the differential output signal and the common mode output signal. This is an efficient solution; however, it is also possible to generate the quotient in the digital domain. For this, one may convert the differential output signal from the gain stages and the common mode output signal separately to the digital domain and perform the normalizing division there. The term analog-to-digital converter may thus refer to a single analog-to-digital converter block, or to a group of two or more analog-to-digital converter blocks of the processing circuit necessary to perform the claimed functions. The dividing circuit may refer, for example, to the analog-to-digital converter or to an element in the digital domain of the processing circuit.

Figure 3:
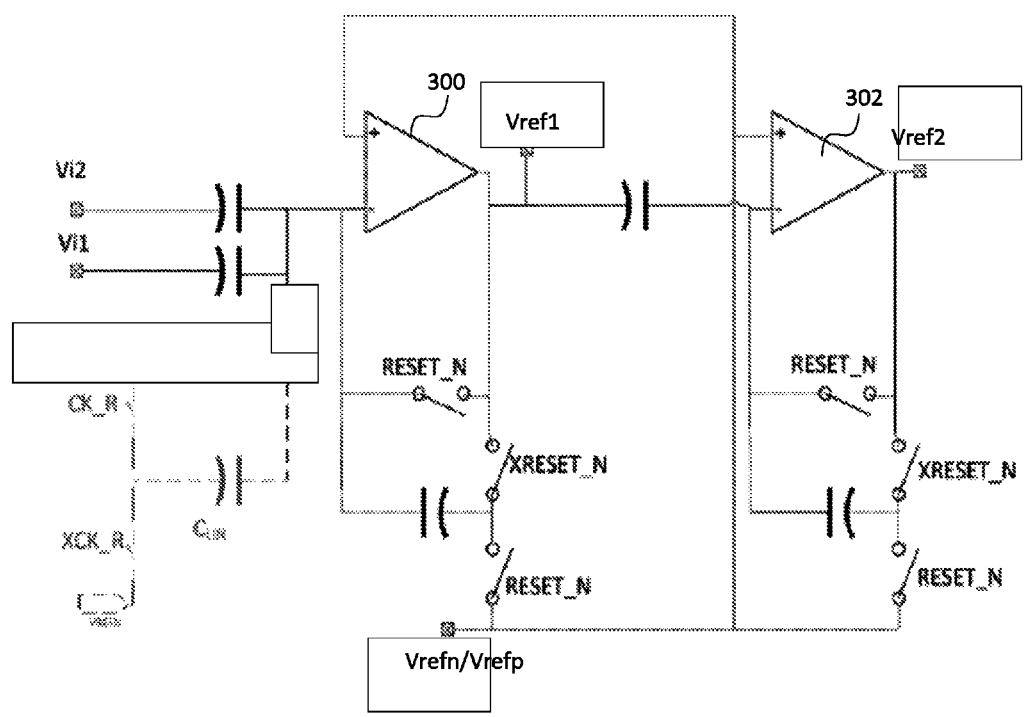
FIG. 3 illustrates a reference voltage generation circuit.

FIG. 3 illustrates an exemplary reference voltage circuit 114 for generating the third and fourth output signals for the analog-to-digital converter 104 of FIG. 1. Other components or circuit configurations, capable of performing the claimed features may be applied without deviating from the scope of protection. FIG. 3 shows voltages Vi1 and Vi2 output from the current-to-voltage converter 210 of FIG. 2. The reference voltage circuit 114 may include two single-ended operational amplifiers 300, 302, non-inverting input of each connected to analog ground. The output voltages Vi1, Vi2 may be input to the inverting input of the operational amplifiers 300, 302, resulting in inverted differential reference voltages Vref1, Vref2. The reference voltage circuit may be made to operate synchronized to the timing of the processing circuit. As shown in FIG. 3, reset of the capacitors may be arranged with switch control signals RESET to follow the timing of the last gain stage. Timing and switch control signals of gain stages will be discussed in more detail later on. The inverted differential reference voltages Vref1, Vref2 may be input as reference voltages to the analog-to-digital converter 104.

Returning again back to FIG. 1, in order to compensate for amplifier imperfections that limit the achievable accuracy of switched-capacitor circuits, a correlated-double-sampling technique may be implemented in the conversion and gain stages. In general, correlated-double-sampling refers to a sampling technique in which the strength of a signal at a node is determined as a difference between the strength of the signal at the node when the signal is coupled to the node and the strength of the signal at the node when the signal is decoupled from the node. FIG. 1 illustrates timing of elements with switches 110, 112 and switch control signals CK_R, XCK_R, the state of which may be up or down. The switch control signals CK_R and XCK_R are inverse such that when CK_R is up, XCK_R is down, and vice versa. When a switch control signal is up, a switch to which the switch control signal is applied will be in a conducting state (closed), and creates a short circuit across the switch. Conversely, when a switch control signal is down, a switch to which the switch control signal is applied will be in a non-conducting state (open), and creates an open circuit at the switch. As shown, the timing control element 108 may alternatively switch a higher reference voltage Vrefp and a lower reference voltage Vrefn to the capacitive transducer 100. Vrefp and Vrefn may also be implemented as a positive and negative power supply. The timing of the current-to-voltage converter 102 and the gain stages 106 is now discussed with FIGS. 2 and 4.

Figure 4:
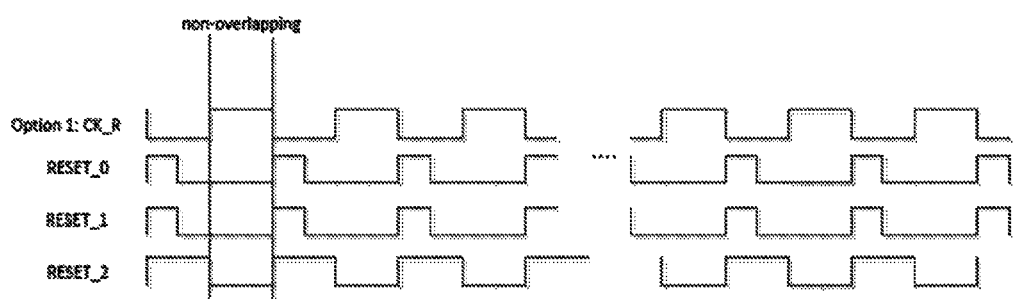
FIG. 4 shows an exemplary method for using switching in the gain stages.

As shown in FIG. 2, switching in the current-to-voltage converter stage 200, the first gain stage 202 and the second gain stage 204 may be controlled with switch control signals RESET_0, RESET_1, RESET_2. FIG. 4 shows an exemplary method for using switching in the gain stages with resets RESET_0, RESET_1, RESET_2 that are synchronized to the timing of the switch control signal CK_R. For correlated double sampling, in the successive chain of gain stages 202, 204, the reset (RESET_2) of a stage 204 needs to be released later than resets (RESET_1 and RESET_0) of stages 200 and 202 preceding it. This means that the folded noise of the preceding gain stages 200, 202 is stored as DC error charge on the input capacitors (Ci2) of the following gain stage 204 before the reset (RESET_2) of this following gain stage 204 is released. More generally, in the case of N gain stages of FIG. 1, at least the reset (RESET_N) of the last gain stage is released later than resets of the earlier gain stages. The reset clocking of FIG. 4 enables canceling of low frequency noise and aliased noise of the previous stages from the output.

Figure 5:
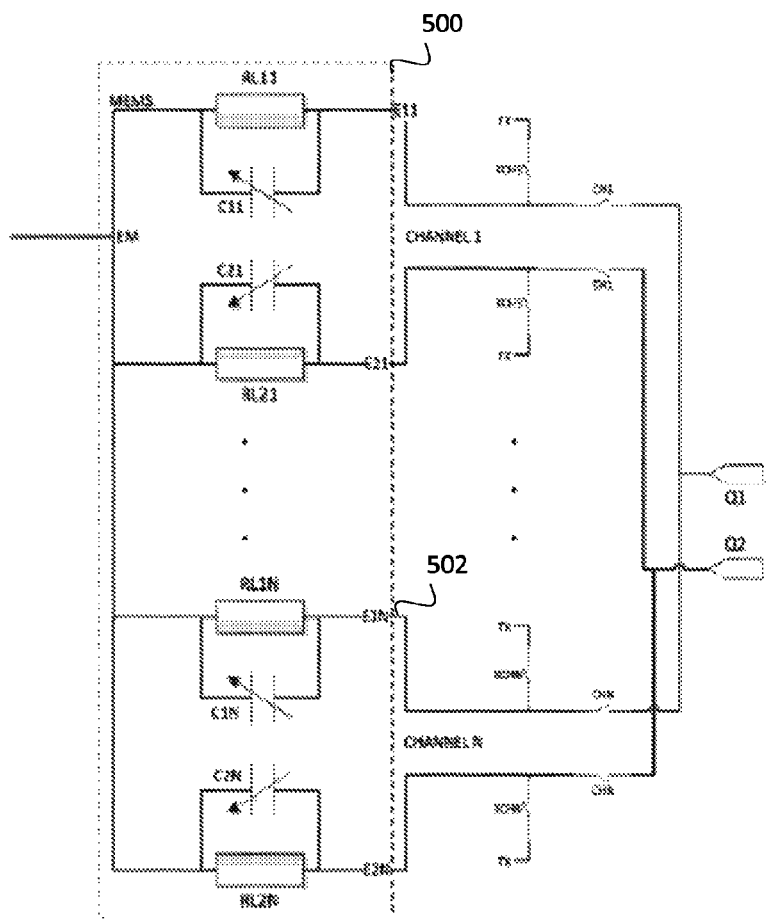
FIG. 5 illustrates a possible multiplexing principle for a configuration where the signal sources have a common mass.
Figure 6:
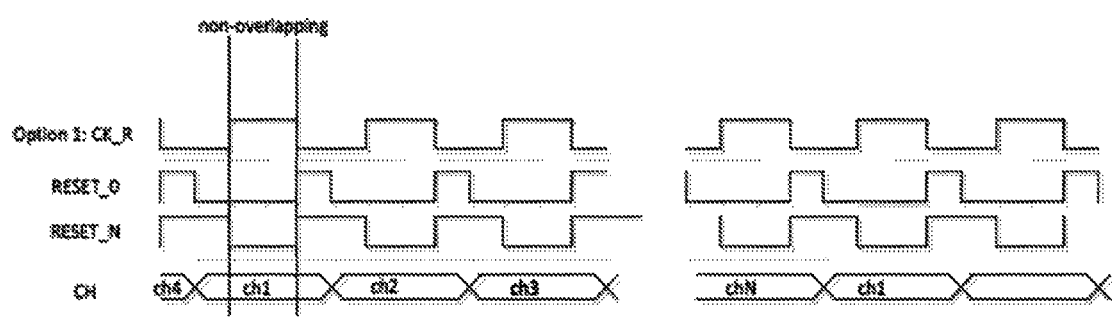
FIG. 6 illustrates possible tinning of channel switches.

As a further advantage, since the described circuit structure does not require analog memory components, the processing circuit of FIG. 1 is well suited for multiplexing, i.e. to process signals of two or more signal channels. A capacitor pair may form a separate channel, and two or more channels may be arranged to share the processing circuit in a time-divisional manner. FIG. 5 illustrates a possible multiplexing principle for a configuration where the signal sources have a common mass (rotor). The processing circuit may be connected to the plurality of capacitive transducer structures 500, 502, which generate differential input signals for the current-to-voltage converter in response to motions of the common mass. A capacitor pair forms a channel that may be connected to the processing circuit through one of channel switches CH1, CH2, ..., CHN. FIG. 5 illustrates a possible configuration of switches CH1, CH2, ..., CHN and inverse switches XCH1, XCH2, ..., XCHN. Terminal TX represents here a connection to be switched on when the channel is in unused state. When a multiplexed channel is not in use, there is no induced voltage over the corresponding stator and rotor electrodes (EM over E1/E2). TX may be, for example, the EM electrode of the capacitive transducer. Connection to EM-net may be used to reduce the effect of external electrostatic forces to the mass (rotor) when the channel is not in use. Similar effect may be achieved through a connection to some low impedance reference. FIG. 6 illustrates possible timing of the channel switches CH1, CH2, ..., CHN in respect of the switch control signals CK_R. As shown, the earlier disclosed timing schemes may be applied in a straightforward manner during multiplexing. Multiplexing may be implemented with a simple switch structure that has only four switches per channel.

Figure 7:
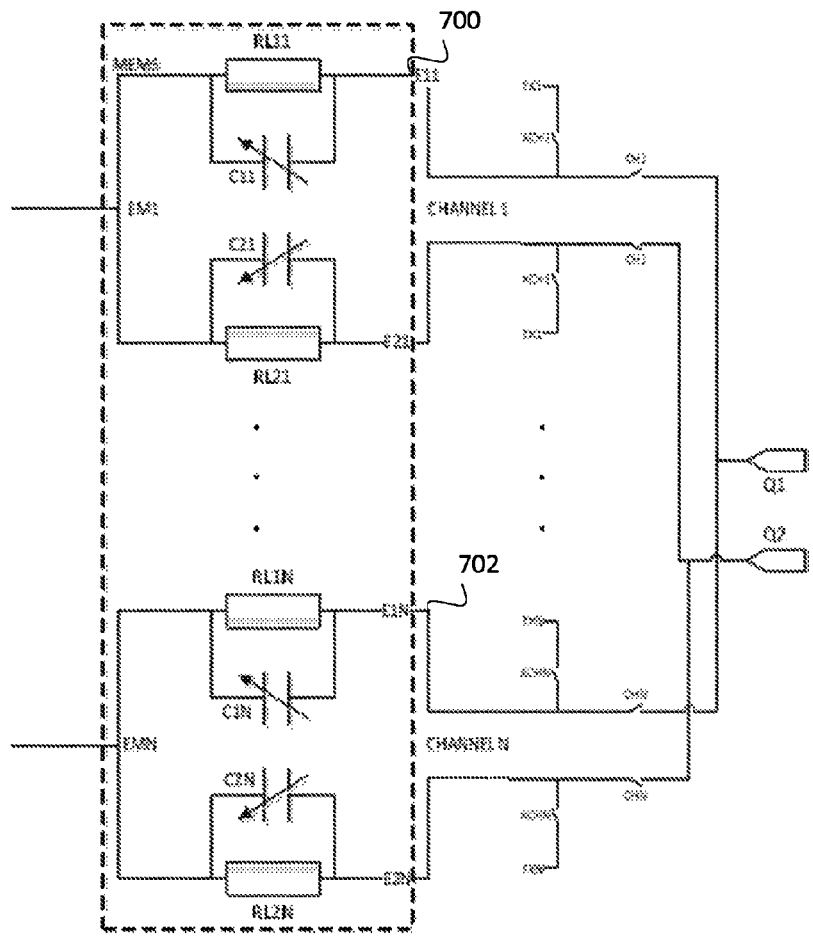
FIG. 7 illustrates an alternative multiplexing principle for a configuration where the signal sources have a separate mass.

FIG. 7 illustrates an alternative multiplexing principle for a configuration where the signal sources have a separate mass. In this alternative, the capacitive transducer structure may include a number of rotor/stator pairs, each of which shows as a separate EM net. The processing circuit may again be connected to the plurality of capacitive transducer structures 700, 702. The switching structure and timing may be implemented in a manner already described in FIG. 6. In this arrangement, in order to reduce the effect of external electrostatic forces to the mass (rotor) when the channel is not in use, TX1, ..., TXN may represent connection of the unused channels to each other in the processing circuit (shorting), or connection to a specific bias voltage.

In multiplexing, signal sources of some channels may include capacitors whose output does not necessitate use of the normalized transfer function. It is understood that the timing control element may be configured to switch normalization with the common mode output signal on or off in a channel-specific manner. For example, for channels of parallel plate capacitors normalization may be switched on, and for channels without parallel plate capacitors normalization may be switched off.

Figure 8:
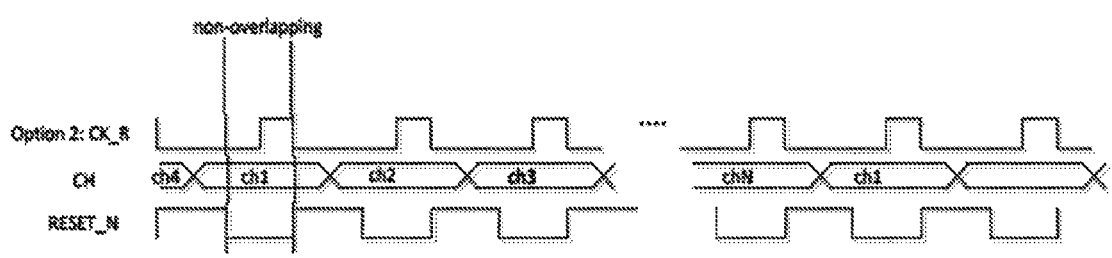
FIG. 8 illustrates a possible tinning scheme for leakage insensitive detection.

Returning again back to FIG. 1, the processing circuit allows also reduction of sensitivity to leakage in the element side, i.e. between the rotor EM and the stator E1/E2. FIG. 8 illustrates a possible timing scheme for such leakage insensitive detection. As shown in FIG. 8, the timing control element may be configured to change polarity of the reference voltage VREFN/VREFP in the middle of a reading period of a channel.

It is also possible to use switching of the processing circuit to implement chopping. In general, chopping refers to a continuous-time modulation technique that avoids noise folding. In general, for chopping, an input voltage is first converted to a square wave voltage with a channel frequency, and the modulated signal is amplified together with its own input offset. In de-chopping after amplification, the signal may be demodulated back to DC and the offset be time modulated to odd harmonics of the frequency. If correlated double sampling is applied in the above described manner, chopping is advantageously performed before and de-chopping after the last gain stage circuit Gain_N. This is because the last gain stage circuit is the only stage in which error sources are not cancelled by the correlated double sampling technique. This relaxes also dynamic range requirements of first gain stage circuit.

Figure 9:
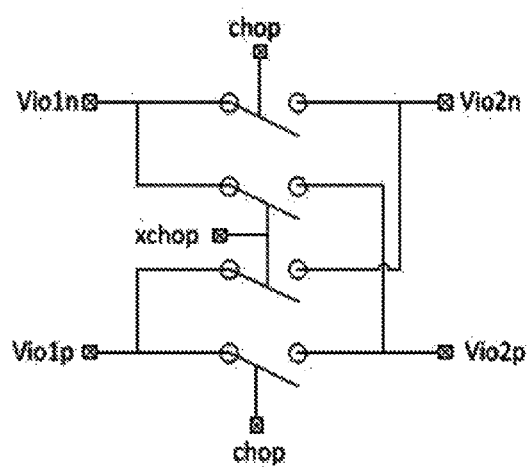
FIG. 9 illustrates a switching configuration to implement de-chopping.

FIG. 9 illustrates an exemplary switching structure to implement de-chopping after the last gain circuit Gain_N of FIG. 1. As understood by a person skilled in the art, for chopping, the same switch structure needs to be vertically flipped. The configuration of FIG. 9 is basically a cross-switch structure that enables timed change of polarity of input voltages Vio1$n$ and Vio1$p$ from the last gain circuit Gain_N into output voltages Vio2$n$ and Vio2$p$ to the analog-to-digital converter. As earlier, switch control elements chop and xchop are inverse to each other.

As shown in FIG. 2, the last gain stage circuit may include an operational amplifier. A switching structure for signal chopping is advantageously before the operational amplifier (before or after input capacitors Ci2) and a switching structure for signal de-chopping after the operational amplifier. If chopping is performed before the first and second output voltages Vi1 and Vi2 are generated, a de-chopping element needs to be in the leg of gain circuits and in the reference voltage generator leg. In such a case, the processing circuit includes the switching structure for signal chopping before generation of the first and second output voltages Vi1 and Vi2, the switching structure for signal de-chopping in the last gain stage circuit Gain_N, and the switching structure for signal de-chopping in the reference voltage generator of FIG. 3 after generation of the common mode output signals Vref1 and Vref2.

Figure 10:
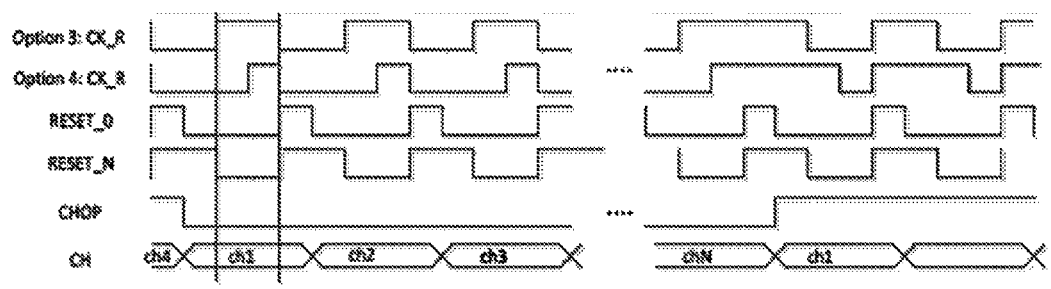
FIG. 10 illustrates a possible tinning scheme for chopping and simultaneous application of chopping and leakage insensitive detection.
Figure 11:
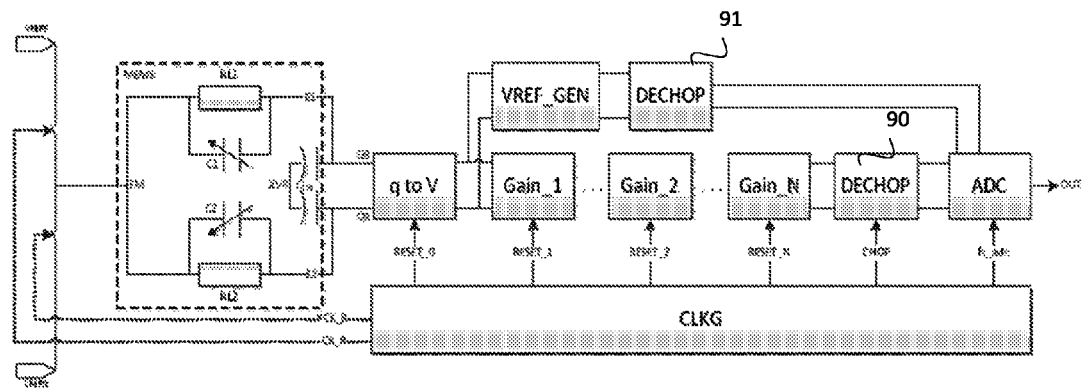
FIG. 11 illustrates an embodiment for a further linearized transfer function.

Option 3 in FIG. 10 illustrates an exemplary possible timing scheme for chopping when implemented before generation of the first and second output voltages Vi1 and Vi2. A corresponding circuit structure with de-chopping elements 90, 91 is illustrated in FIG. 11. Option 4 in FIG. 10 illustrates a timing scheme that enables simultaneous application of chopping and the leakage insensitive detection of FIG. 8 for the plurality of multiplexed channels.

FIG. 11 illustrates also a further embodiment of the invention. As discussed above, the normalized transfer function of equation (1) is preferred because of the linear and stabile response it provides. However, even more linear transfer function may be achieved with one or more linearity compensation capacitors $C_{LIN}$, one capacitor plate of which is connected to opposite polarity than the polarity of a capacitive transducer of the EM net. In FIG. 11 two parallel linearity compensation capacitors are connected to the input of the current-to-voltage converter. The polarity of the EM net is labeled with VR and the opposite polarity of the linearization capacitors with XVR. The linearization capacitors $C_{LIN}$ compensate inherent parasitic capacitances of the variable capacitors C1 and C2. The configuration thus gives a DC transfer a function $$\mathrm{Out}(C1, C2) = \frac{C1 - C2}{C1 + C2 - C_{LIN}} \cdot \mathrm{Const} \qquad (2)$$

Figure 12:
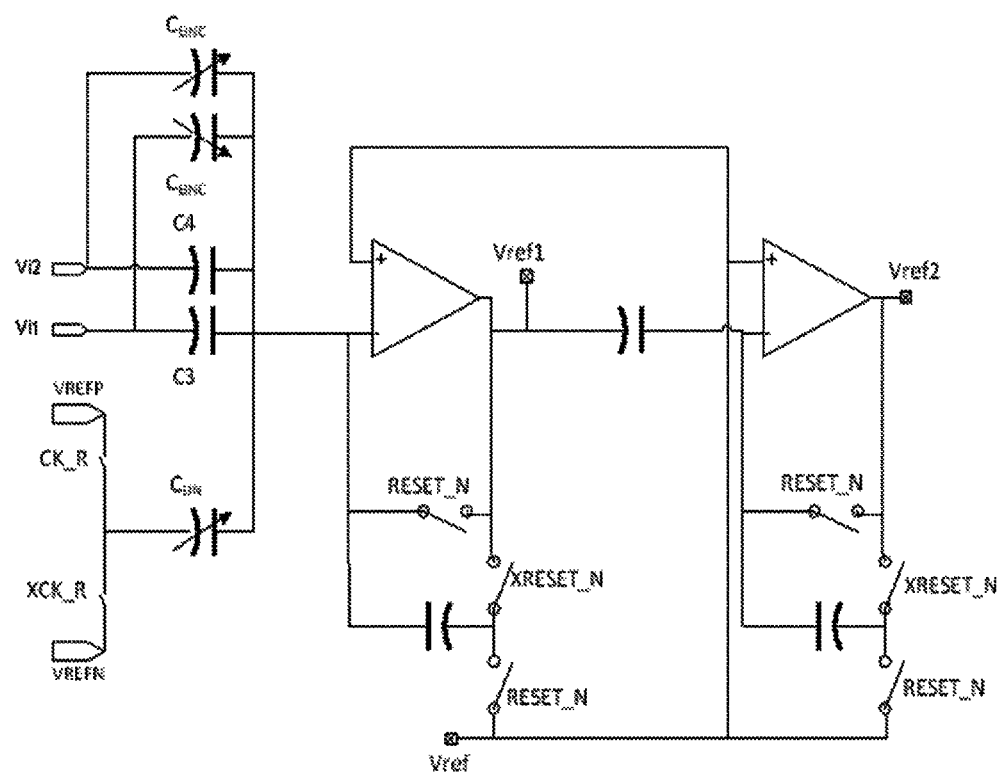
FIG. 12 illustrates an alternative configuration for the further linearized transfer function.

FIG. 12 illustrates an alternative configuration where the additional linearization capacitor $C_{LIN}$ is in the voltage generator 114 of FIG. 1. FIG. 12 illustrates also two identical variable linear capacitors $C_{LINC}$ that may be configured to compensate the effect of $C_{LIN}$ on Vref1/Vref2 levels.

Figure 13:
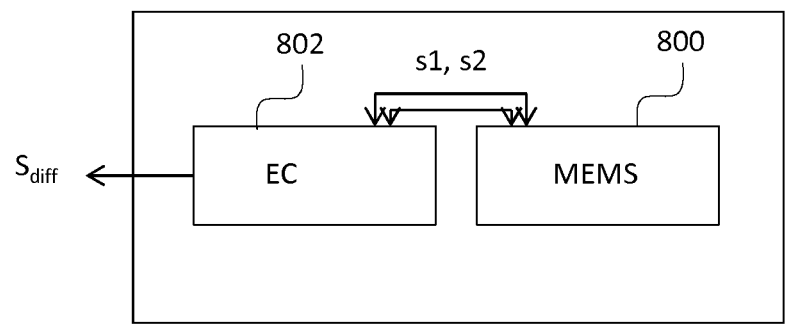
FIG. 13 illustrates an embodiment of a MEMS device that includes the processing circuit.

The schematic of FIG. 13 illustrates an embodiment of a MEMS device that includes the processing circuit of FIG. 1. The MEMS device may include a first part 800 and a second part 802. The first part 800 may include a the capacitive transducer and the second part 802 may include a processing circuit of FIG. 1 connected to process signals from the capacitive transducer of the MEMS element. As shown in FIG. 13, signals are exchanged between the first part and the second part. Specifically, signals s1, s2 from a capacitive transducer of the first part may be input to the electrical circuit of the second part 802 to generate the differential output signal and the common mode output signal, and a digital signal that implements the transfer function of equation (1) or (2) as disclosed above.

It is apparent to a person skilled in the art that as technology advances, the basic idea of the invention can be implemented in various ways. The invention and its embodiments are therefore not restricted to the above examples, but they may vary within the scope of the claims.

The invention claimed is:

1. A processing circuit for processing input signals from a capacitive transducer structure, the processing circuit comprising:
   a current-to-voltage converter;
   one or more successive gain stage circuits;
   a reference voltage generator;
   dividing circuitry comprising an analog-to-digital converter; wherein
   the current-to-voltage converter includes circuitry for
      receiving a first input signal and a second input signal from the capacitive transducer structure,
      outputting to a first gain stage of the gain stage circuits, and to the reference voltage generator a first voltage signal that corresponds to the first input signal, and a second voltage signal that corresponds to the second input signal;
   the gain stages include circuitry for generating from the first voltage signal and the second voltage signal a differential output signal;
   the reference voltage generator includes circuitry for generating from the first voltage signal and the second voltage signal a common mode output signal;
   the dividing circuitry is configured to generate a digital signal that corresponds to a quotient of the differential output signal and the common mode output signal.

2. The processing circuit of claim 1, wherein the differential output signal is configured as an input signal for the analog-to-digital converter, and the common mode output signal is configured as a reference voltage for the analog-to-digital converter block.

3. The processing circuit of claim 2, wherein the analog-to-digital converter block is a differential analog-to-digital converter.

4. The processing circuit of claim 1, wherein
   the analog-to-digital converter includes an analog-to-digital converter block for the differential output signal and another analog-to-digital converter block for the common mode output signal,
   outputs of the analog-to-digital converter blocks are connected to a dividing element in the digital domain.

5. The processing circuit of claim 2, wherein
   the reference voltage generator includes circuitry for generating a first common mode output signal and a second common mode signal, the difference of the first common mode output signal and the second common mode signal corresponding to a common mode component of the of the first voltage signal and the second voltage signal;
   a first common mode output signal and a second common mode signal are used in generation of the digital signal in the dividing circuitry.

6. The processing circuit of claim 1, wherein
   the processing circuit includes two or more gain stage circuits,
   the processing circuit includes a switch configuration with switches and a timing control element for timed resetting of the gain stage circuits;
   the timing control element is configured to release reset of the last gain stage later than resets of the earlier gain stages.

7. The processing circuit of claim 1, wherein
   the capacitive transducer structure includes two or more signal sources;
   the signal sources form channels that are arranged to share the processing circuit in a time-divisional manner.

8. The processing circuit of claim 7, wherein the signal sources have a common mass.

9. The processing circuit of claim 7, wherein the signal sources have separate masses.

10. The processing circuit of claim 1, wherein
    the processing circuit includes a switch configuration with switches and a timing control element for timed control of reference voltage level of the capacitive transducer structure;
    the timing control element is configured to change of polarity of the reference voltage level of the capacitive transducer structure in the middle of a reading period of a channel.

11. The processing circuit of claim 1, wherein
    the last gain stage circuit includes an amplifier, circuitry for signal chopping before the amplifier and circuitry for signal de-chopping after the amplifier.

12. The processing circuit of claim 1, wherein
    the processing circuit includes circuitry for signal chopping before generation of the first voltage signal and the second voltage signal;
    circuitry for signal de-chopping in the last gain stage circuit; and
    circuitry for signal de-chopping in the reference voltage generator after generation of the common mode output signal.

13. The processing circuit of claim 1, wherein
    the processing circuit includes a linearization capacitor;
    one capacitor plate of the linearization capacitor is connected to opposite polarity than polarity of the capacitive transducer structure.

14. The processing circuit of claim 13, wherein two linear capacitors are connected to the input of the current-to-voltage capacitor.

15. The processing circuit of claim 13, wherein a linear capacitor is included in the voltage reference generator.

16. The processing circuit of claim 15, wherein the voltage reference generator includes at least one variable linear capacitor $C_{LINC}$ that is configured to compensate the effect of the linearization capacitor on the generated common mode output signal.

17. A MEMS device that includes the processing circuit according to claim 1.

* * * * *